US012482726B2

United States Patent
Tremlett et al.

(10) Patent No.: US 12,482,726 B2
(45) Date of Patent: Nov. 25, 2025

(54) BUSBAR WITH DIELECTRIC COATING

(71) Applicant: Microchip Technology Caldicot Limited, Caldicot (GB)

(72) Inventors: Piers Tremlett, Coleford (GB); George Taylor, Wales (GB)

(73) Assignee: Microchip Technology Caldicot Limited, Caldicot (GB)

(*) Notice: Subject to any disclaimer, the term of this patent is extended or adjusted under 35 U.S.C. 154(b) by 519 days.

(21) Appl. No.: 17/976,943

(22) Filed: Oct. 31, 2022

(65) Prior Publication Data

US 2023/0326834 A1  Oct. 12, 2023

Related U.S. Application Data

(60) Provisional application No. 63/330,265, filed on Apr. 12, 2022.

(51) Int. Cl.
*H01L 23/492* (2006.01)
*H01L 23/00* (2006.01)
(Continued)

(52) U.S. Cl.
CPC ...... *H01L 23/4922* (2013.01); *H01L 23/3672* (2013.01); *H01L 23/3677* (2013.01); *H01L 23/3735* (2013.01); *H01L 23/46* (2013.01); *H01L 23/49838* (2013.01); *H01L 24/29* (2013.01); *H01L 24/32* (2013.01);
(Continued)

(58) Field of Classification Search
CPC ............. H01L 23/4922; H01L 23/3672; H01L 23/3677; H01L 23/3735; H01L 23/46; H01L 23/49838; H01L 24/4924; H01L 24/29; H01L 24/32; H01L 24/33; H01L 25/0657; H01L 25/074; H01L 25/162; H01L 2224/29109; H01L 2224/29113; H01L 2224/29124; H01L 2224/29139; H01L 2224/19147; H01L 2224/32245; H01L 2224/33181; H01L 2225/06572; H01L 2225/06589
See application file for complete search history.

(56) References Cited

U.S. PATENT DOCUMENTS 3,621,108 A   11/1971  Cleaveland ................... 174/5 R
6,215,681 B1   4/2001  Schuurman et al. ......... 363/141
(Continued)

FOREIGN PATENT DOCUMENTS

JP   2006135239 A   5/2006

OTHER PUBLICATIONS

International Search Report and Written Opinion, Application No. PCT/US2022/048921, 14 pages, Mar. 13, 2023.

*Primary Examiner* — Peniel M Gumedzoe
(74) *Attorney, Agent, or Firm* — SLAYDEN GRUBERT BEARD PLLC

(57) ABSTRACT

An apparatus includes a busbar and a heat-generating electronic device mounted on a first side of the busbar, the heat-generating electronic device being electrically and thermally coupled to the first side of the busbar. The busbar includes an array of non-planar physical structures on a second side of the busbar opposite the first side of the busbar. The apparatus includes a dielectric coating on the array of non-planar physical structures, the dielectric coating defining a non-planar dielectric surface on the second side of the busbar.

22 Claims, 6 Drawing Sheets

(51) Int. Cl.
  *H01L 23/367*  (2006.01)
  *H01L 23/373*  (2006.01)
  *H01L 23/46*   (2006.01)
  *H01L 23/498*  (2006.01)
  *H01L 25/065*  (2023.01)
  *H01L 25/07*   (2006.01)
  *H01L 25/16*   (2023.01)

(52) U.S. Cl.
  CPC .......... *H01L 24/33* (2013.01); *H01L 25/0657* (2013.01); *H01L 25/074* (2013.01); *H01L 25/162* (2013.01); *H01L 23/4924* (2013.01); *H01L 2224/29109* (2013.01); *H01L 2224/29113* (2013.01); *H01L 2224/29124* (2013.01); *H01L 2224/29139* (2013.01); *H01L 2224/29147* (2013.01); *H01L 2224/32245* (2013.01); *H01L 2224/33181* (2013.01); *H01L 2225/06572* (2013.01); *H01L 2225/06589* (2013.01)

(56) References Cited

U.S. PATENT DOCUMENTS

| | | | |
|---|---|---|---|
| 2005/0083652 A1 | 4/2005 | Jairazbhoy et al. | 361/689 |
| 2009/0161301 A1 | 6/2009 | Woody et al. | 361/678 |
| 2013/0009168 A1* | 1/2013 | Tsuchiya | H01L 23/473 |
| | | | 257/77 |
| 2020/0058574 A1* | 2/2020 | Hayase | H01L 23/4012 |

* cited by examiner

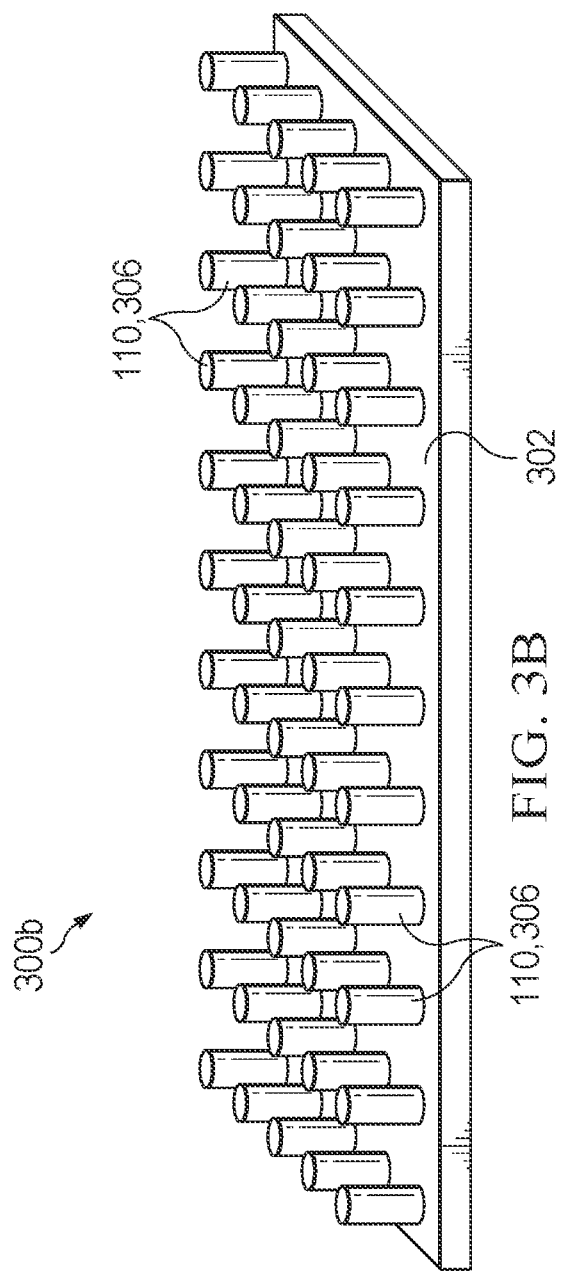

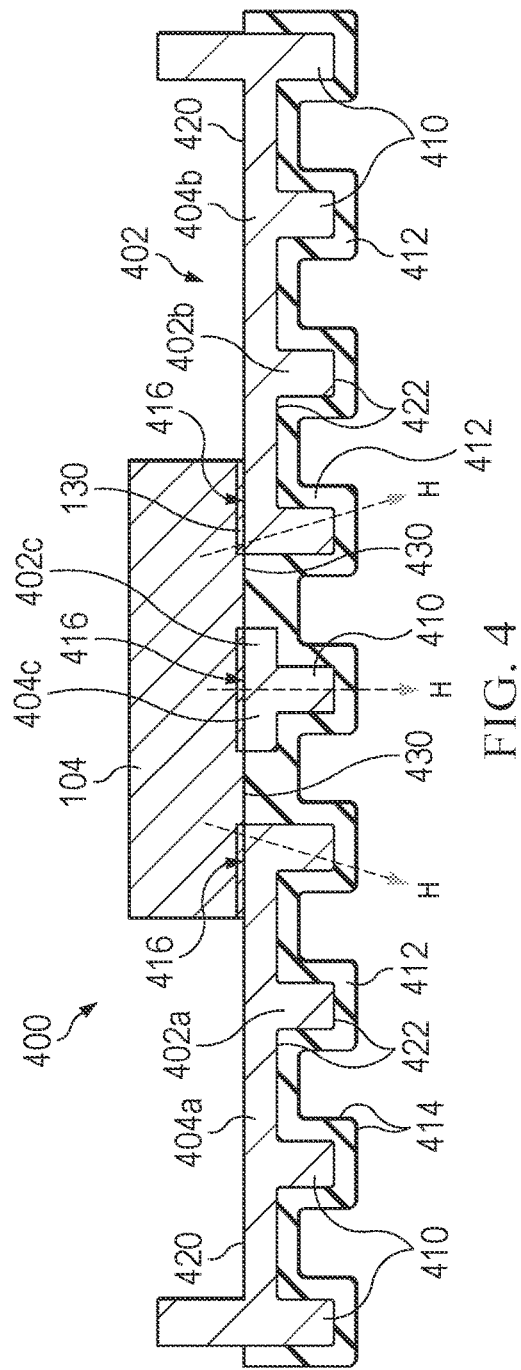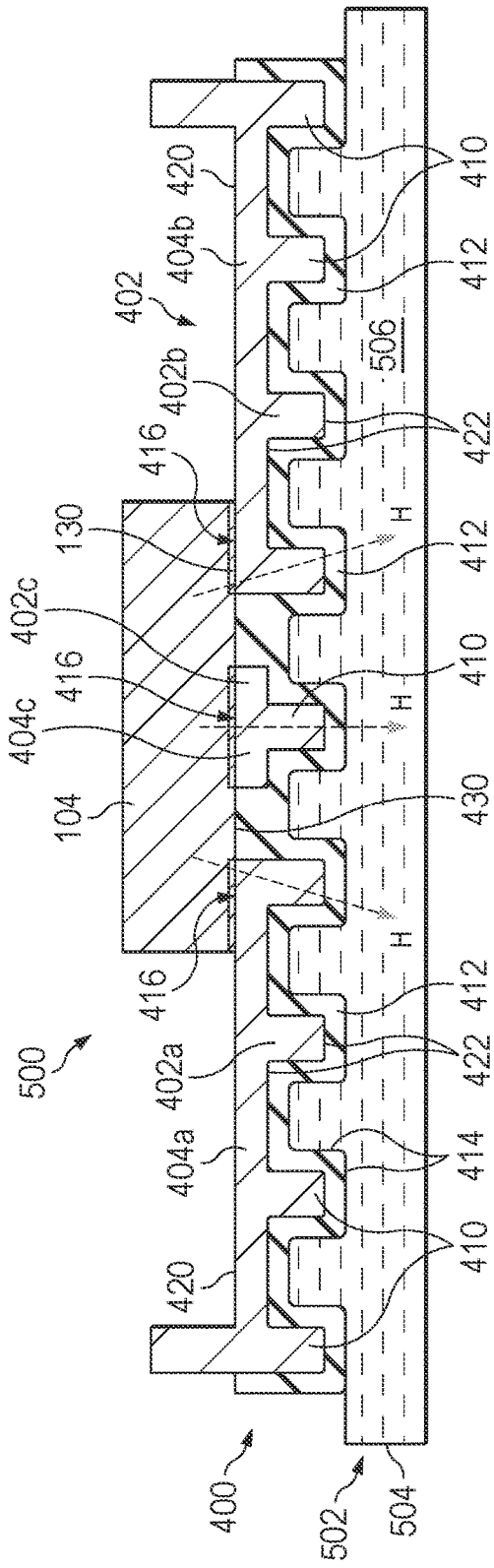

BUSBAR WITH DIELECTRIC COATING

RELATED PATENT APPLICATION

This application claims priority to commonly owned United States Provisional Patent Application No. 63/330, 265 filed Apr. 12, 2022, the entire contents of which are hereby incorporated by reference for all purposes.

TECHNICAL FIELD

The present disclosure relates to electronic devices, and more particularly to a busbar with a dielectric coating.

BACKGROUND

Electronic devices can often be improved by increasing the power/weight or power/volume ratio of the respective device. For an electronic device including a busbar for carrying current, for example a power inverter module for an electric vehicle (EV), the power/weight or power/volume ratio of the respective device may be improved by reducing the weight and/or size thermal management system (e.g., heatsink) provided for cooling the busbar.

A conventional busbar and heatsink system for an electronic device, e.g., a power inverter module, includes:
  (a) a dielectric substrate, e.g., comprising alumina, silicon nitride ($Si_3N_4$), aluminum nitride (AlN), a polymer and glass weave, other ceramic material, or other dielectric material;
  (b) a conductive layer (e.g., comprising copper or aluminum) formed on a first side of the dielectric substrate, e.g., for carrying current to an electronic device mounted thereon (e.g., a die or a module including one or more dies and/or other circuitry);
  (c) a thermal stress balancing layer (e.g., a copper layer) formed on a second side of the dielectric substrate, to reduce stresses on the dielectric substrate caused by thermal expansion of the conductive layer;
  (d) a metal heatsink in contact with a cooling fluid; and
  (e) a thermal connection layer (e.g., a solder or other metallurgical connection, or a thermal interface material (TIM)) coupling the thermal stress balancing layer to the metal heatsink.

The conventional busbar and heatsink system often includes numerous components and adds significant weight and volume to the relevant electronic device, e.g., power inverter module.

There is a need for an improved busbar and heatsink system, e.g., including fewer components and/or having lower weight and/or volume as compared with conventional busbar and heatsink systems.

SUMMARY

The present disclosure provides busbars that (a) carry electrical current to and/or away from a heat-generating electronic device, and also (b) function as a heatsink to facilitate heat transfer away from the heat-generating electronic device mounted thereon. The heat-generating electronic device may comprise, for example, a power transistor, multiple power transistors, a module including one or more power transistors and/or other circuit components, an integrated circuit (IC) die or a module including one or more IC die and/or other circuit components.

As disclosed herein, a busbar may include an array of non-planar physical structures (e.g., fins, fins, ridges, or grooves) on a side of the busbar opposite a heat-generating electronic device mounted thereon, and a dielectric coating formed on the array of non-planar physical structures to define a non-planar surface of the busbar, which non-planar surface may be exposed to a cooling fluid to increase heat transfer away from the heat-generating electronic device. The dielectric coating may function as a voltage insulation layer, e.g., to electrically insulate the busbar from the cooling fluid to avoid electrical shorting.

Some examples provide various advantages as compared with certain conventional devices. For example, by locating the voltage insulation layer (dielectric coating) on the busbar, instead of between the heat-generating electronic device and the heatsink as in the conventional design discussed in the Background section, the potential for subjecting the cooling fluid to voltage (a potential safety hazard) may be reduced.

As another example, a busbar having a non-planar surface exposed to a cooling fluid, e.g., as compared with planar surfaces of conventional devices, may provide an increased surface area for heat transfer to increase heat transfer from the heat-generating electronic device to the cooling fluid.

One aspect provides an apparatus including a busbar and a heat-generating electronic device mounted on a first side of the busbar, the heat-generating electronic device being electrically and thermally coupled to the first side of the busbar. The busbar includes an array of non-planar physical structures on a second side of the busbar opposite the first side of the busbar. The apparatus also includes a dielectric coating on the array of non-planar physical structures, the dielectric coating defining a non-planar dielectric surface on the second side of the busbar.

In some examples, the apparatus includes a fluid chamber to receive a cooling fluid, wherein the non-planar dielectric surface on the first side of the busbar defines at least a portion of an interior surface of the fluid chamber.

In some examples, the busbar comprises copper, aluminum, silver, or gold, an alloy of copper, an alloy of aluminum, an alloy of silver, or an alloy of gold; and the dielectric coating comprises a polymer, a ceramic, an epoxy, polyphenylene sulfide (PPS), liquid crystal polymer (LCP), polytetrafluoroethylene (PTFE), parylene, polyether ether ketone (PEEK), or a composition including PEEK and parylene.

In some examples, the dielectric coating comprises multiple layers of different materials.

In some examples, the busbar has a thickness in the range of 50 μm-5000 μm, and the dielectric coating has a thickness in the range of 0.05 μm-500 μm. For example, the busbar may have a thickness in the range of 300 μm-3000 μm, and the dielectric coating may have a thickness in the range of 1 μm-50 μm.

In some examples, the array of non-planar physical structures on the busbar comprises pins or fins.

In some examples, the busbar includes a hollow or porous structure defining the array of non-planar physical structures.

In some examples, a surface area of the non-planar dielectric surface is at least two times a planar footprint area of the non-planar dielectric surface.

In some examples, the busbar includes multiple electronic device contacts electrically connected to the heat-generating electronic device.

In some examples, the busbar includes multiple distinct busbar components, wherein respective busbar components include respective electronic device contacts electrically connected to the heat-generating electronic device.

In some examples, the apparatus includes a thermal interface structure arranged between the heat-generating electronic device and the second side of the busbar, wherein the thermal interface structure and the busbar comprise different metals.

One aspect provides an apparatus including a first busbar, a second busbar, and a heat-generating electronic device mounted between a first side of the first busbar and a first side of the second busbar, the heat-generating electronic device being electrically and thermally coupled to both the first side of the first busbar and the first side of the second busbar. The first busbar includes a first array of non-planar physical structures on a second side of the first busbar opposite the first side of the first busbar, and a first dielectric coating formed on the first array of non-planar physical structures defining a first non-planar dielectric surface on the second side of the first busbar. The second busbar includes a second array of non-planar physical structures on a second side of the second busbar opposite the first side of the second busbar, and a second dielectric coating formed on the second array of non-planar physical structures defining a second non-planar dielectric surface on the second side of the second busbar.

In some examples, the apparatus includes (a) a first fluid chamber to receive a first cooling fluid, wherein the first non-planar dielectric surface on the second side of the first busbar defines at least a portion of an interior surface of the first fluid chamber, and (b) a second fluid chamber to receive a second cooling fluid, wherein the second non-planar dielectric surface on the second side of the second busbar defines at least a portion of an interior surface of the second fluid chamber.

In some examples, the first fluid chamber and the second fluid chamber are both part of a common fluid chamber.

In some examples, the second cooling fluid is the same as the first cooling fluid.

In some examples, the first busbar has a thickness in the range of 50 μm-5000 μm, the second busbar has a thickness in the range of 50 μm-5000 μm, the first dielectric coating has a thickness in the range of 0.05 μm-500 μm, and the second dielectric coating has a thickness in the range of 0.05 μm-500 μm.

In some examples, the first array of non-planar physical structures comprises pins or fins.

In some examples, the first busbar includes a hollow or porous structure defining the first array of non-planar physical structures.

In some examples, a surface area of the first non-planar dielectric surface is at least two times a planar footprint area of the first non-planar dielectric surface, and a surface area of the second non-planar dielectric surface is at least two times a planar footprint area of the second non-planar dielectric surface.

One aspect provides a device including a first heat-generating electronic device and a second heat-generating electronic device arranged selectively between a first fluid-cooled busbar apparatus, a second first fluid-cooled busbar apparatus, and a third first fluid-cooled busbar apparatus. The first fluid-cooled busbar apparatus includes a first busbar including a first array of non-planar physical structures, and a first dielectric coating on the first array of non-planar physical structures defining a first non-planar dielectric surface on the first busbar, and a first fluid chamber to receive a first cooling fluid, the first fluid chamber having a first interior surface at least a portion of which is defined by the first non-planar dielectric surface on the first busbar. The second fluid-cooled busbar apparatus includes a second busbar including a second array of non-planar physical structures, a second dielectric coating on the second array of non-planar physical structures defining a second non-planar dielectric surface on the second busbar, and a second fluid chamber to receive a second cooling fluid, the second fluid chamber having a second interior surface at least a portion of which is defined by the second non-planar dielectric surface on the second busbar. The third fluid-cooled busbar apparatus includes a third busbar including a third array of non-planar physical structures, a third dielectric coating on the third array of non-planar physical structures defining a third non-planar dielectric surface on the third busbar, and a third fluid chamber to receive a third cooling fluid, the third fluid chamber having a third interior surface at least a portion of which is defined by the third non-planar dielectric surface on the third busbar. The first heat-generating electronic device is mounted between the first busbar and the second busbar, and the second heat-generating electronic device is mounted between the second busbar and the third busbar.

In some examples, the first busbar defines a first terminal, the second busbar defines a second terminal, and the third busbar defines a third terminal. In some examples, the device comprises a half-bridge device, wherein the first terminal comprises a +DC terminal, the second terminal comprises an AC terminal, and the third terminal comprises a DC GND terminal.

In some examples, the second busbar includes a second busbar first portion at a first side of the second fluid chamber, and a second busbar second portion at a second side of the second fluid chamber, wherein the first heat-generating electronic device is mounted to the second busbar first portion, and the second heat-generating electronic device is mounted to the second busbar second portion.

BRIEF DESCRIPTION OF THE DRAWINGS

Example aspects of the present disclosure are described below in conjunction with the figures, in which:

FIGS. 3A and 3B are three-dimensional views of two example busbar structures for the example busbar shown in FIGS. 1 and 2;

FIG. 4 is a side cross-sectional view of an example apparatus including a busbar and heat-generating electronic device, wherein the busbar includes multiple distinct busbar components;

FIG. 5 is a side cross-sectional view of an example fluid-cooled busbar system including the example busbar and heat-generating electronic device shown in FIG. 4 and an example fluid cooling system thermally coupled to the busbar;

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
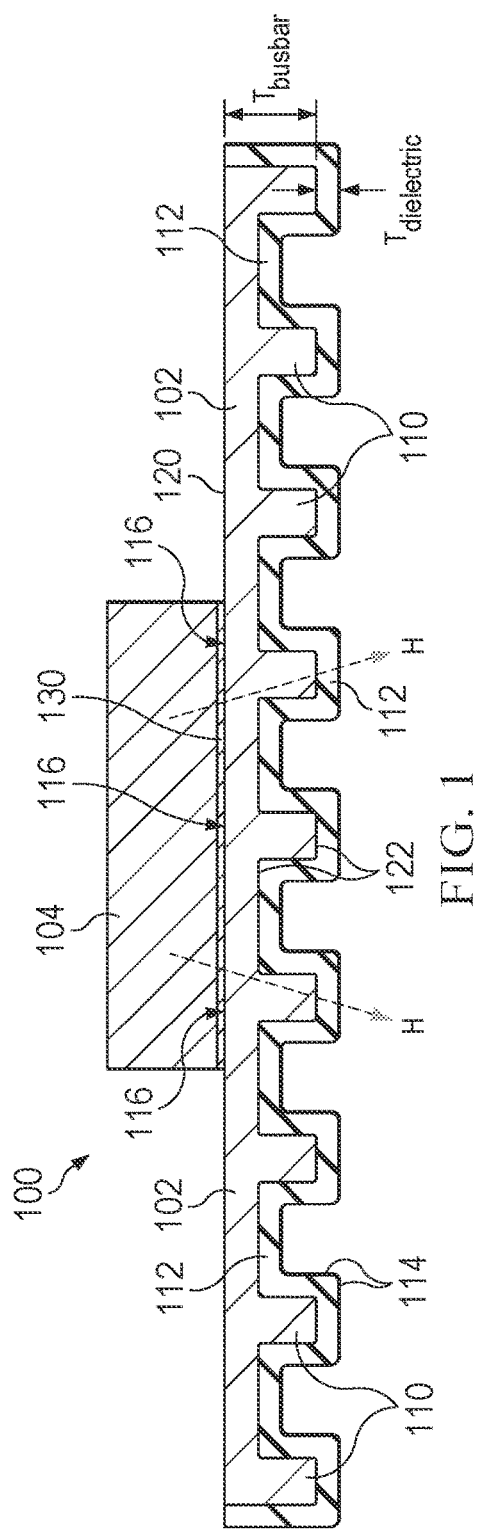
FIG. 1 is a side cross-sectional view of an example apparatus including a busbar and a heat-generating electronic device mounted thereon.

FIG. 1 is a side cross-sectional view of an example apparatus 100 including a busbar 102 and a heat-generating electronic device 104 mounted on a first side 120 of the busbar 102, wherein the heat-generating electronic device 104 is electrically and thermally coupled to the first side 120 of the busbar 102. The busbar 102 includes an array of non-planar physical structures 110 on a second side 122 of the busbar 102 opposite the first side 120. The non-planar physical structures 110 may facilitate heat transfer from the heat-generating electronic device 104, e.g., as generally represented by arrows labelled "H."

A dielectric coating 112 is formed on the array of non-planar physical structures 110, the dielectric coating 112 defines a non-planar dielectric surface 114 on the second side 122 of the busbar 102. As discussed below with reference to FIG. 3, in some examples the non-planar dielectric surface 114 may be exposed to a cooling fluid for facilitating heat transfer from the heat-generating electronic device 104 to the cooling fluid through the busbar 102 and dielectric coating 112.

The busbar 102 may be formed from any metal, for example copper, aluminum, silver, gold, an alloy of copper, an alloy of aluminum, an alloy of silver, or an alloy of gold, or other electrically and thermally conductive material. In some examples the busbar 102 may have a thickness $T_{busbar}$ in the range of 50 μm-5000 μm, for example in the range of 300 μm-3000 μm. In the example shown in FIG. 1, the busbar 102 comprises a single continuous structure defining one terminal. In other examples, e.g., as shown in FIGS. 4 and 5 discussed below, the busbar 102 may comprise multiple discrete structures defining multiple (e.g., two or three) terminals.

The heat-generating electronic device 104, also referred to herein as the electronic device 104 for convenience, may comprise one or more integrated circuit (IC) dies, a module including one or more IC dies and/or other circuitry, discrete electronic components (e.g., one or more transistors, resistors, capacitors, diodes, and/or other discrete electronic components), or any other electronic device or devices that generate or emit heat. In some examples the heat-generating electronic device 104 may comprise a power module. For example, the example half-bridge device shown in FIG. 6 discussed below includes a heat-generating electronic device 104 comprising a power module. Some examples provide a device or system including multiple heat-generating electronic devices 104. For example, the example half-bridge device shown in FIG. 7 discussed below includes a power module provided in two distinct heat-generating electronic devices 104, namely a "high side" power module component and a separate "low side" power module component.

In some examples, the electronic device 104 may be secured to the first side 120 of the busbar 102 by a metallurgical connection (e.g., a solder connection, brazed connection, ultrasonic bond, or sinter bond) or a mechanical connection (e.g., bolted). In addition, an optional electrical/thermal interface material 130 may be arranged between the electronic device 104 and the busbar 102, e.g., providing improved electrical contact and improved thermally conductive contact. The optional electrical/thermal interface material 130 may comprise a different metal than the busbar 102. In some examples, the optional electrical/thermal interface material 130 may be a corrugated or dimpled metal sheet arranged between the electronic device 104 and the busbar 102. In other examples, the optional electrical/thermal interface material 130 may comprise a metallurgical joint, e.g., a solder connection or brazed connection. In some examples, the optional electrical/thermal interface material 130 may include a soft metal, for example aluminum, copper, silver, indium, bismuth, or an alloy of any of the listed metals.

In some examples, respective components of the electronic device 104 may be electrically connected to respective electronic device contacts 116 provided on the busbar 102. For example, for an electronic device 104 comprising a removable module, the electronic device contacts 116 provided on the busbar 102 may include at least one direct current (DC) connection and at least one alternating current (AC) connection. As another example, for an electronic device 104 comprising a non-removable semiconductor switch, e.g., a field-effect transistor (FET) or an insulated gate bipolar transistor (IGBT), the electronic device contacts 116 provided on the busbar 102 may include at least one power pin and at least one signal pin (e.g., two power pins and one signal pin).

The array of non-planar physical structures 110 on the second side 122 of the busbar 102 may include pins, fins, ridges, grooves, a porous structure (e.g., an open sintered structure defined by an array of metal spheres welded together), or any other non-planar structures. In some examples, e.g., as shown in FIG. 2A discussed below, the second side 122 of the busbar 102 may be crenelated, i.e., wherein the non-planar physical structures 110 comprise an array of crenels and merlons.

The dielectric coating 112 formed on the array of non-planar physical structures 110 (which defines the non-planar dielectric surface 114 on the second side 122 of the busbar 102) may include a single layer or multiple layers. For example, dielectric coating 112 may include a single layer comprising a polymer, a ceramic (e.g., $Al_2O_3$), an epoxy, polyphenylene sulfide (PPS), liquid crystal polymer (LCP), polytetrafluoroethylene (PTFE), parylene, polyether ether ketone (PEEK), or a composition including PEEK and parylene. As another example, dielectric coating 112 may include multiple layers of different materials, with respective layers comprising a polymer, a ceramic (e.g., $Al_2O_3$), an epoxy, PPS, LCP, PTFE, parylene, PEEK, or a composition including PEEK and parylene.

In some examples, the dielectric coating 112 may be deposited by E-coating (also referred to as electrophoretic deposition or electro-coating), electrostatic deposition, liquid coating, powder coating, chemical vapor deposition (CVD) (e.g., for depositing a dielectric coating 112 comprising parylene), cathodic arc physical vapor deposition (PVD), atomic layer deposition (ALD), or vacuum molding a thin film.

In some examples, the dielectric coating 112 may have a thickness $T_{dielectric}$ in the range of 0.05 μm-500 μm, for example, in the range of 1 μm-50 μm. Thus in some examples the thickness of the dielectric coating 112 (e.g., 0.05 μm-500 μm, or 1 μm-50 μm) may be significantly smaller than the thickness of the busbar 102 specified above (e.g., 50 μm-5000 μm, or 300 μm-3000 μm).

In some examples, the non-planar dielectric surface 114 defined by the dielectric coating 112 formed over the non-planar physical structures 110 may have a total surface area at least 2 times, at least 5 times, or at least 10 times a planar footprint area of the same non-planar dielectric surface 114.

Figure 2:
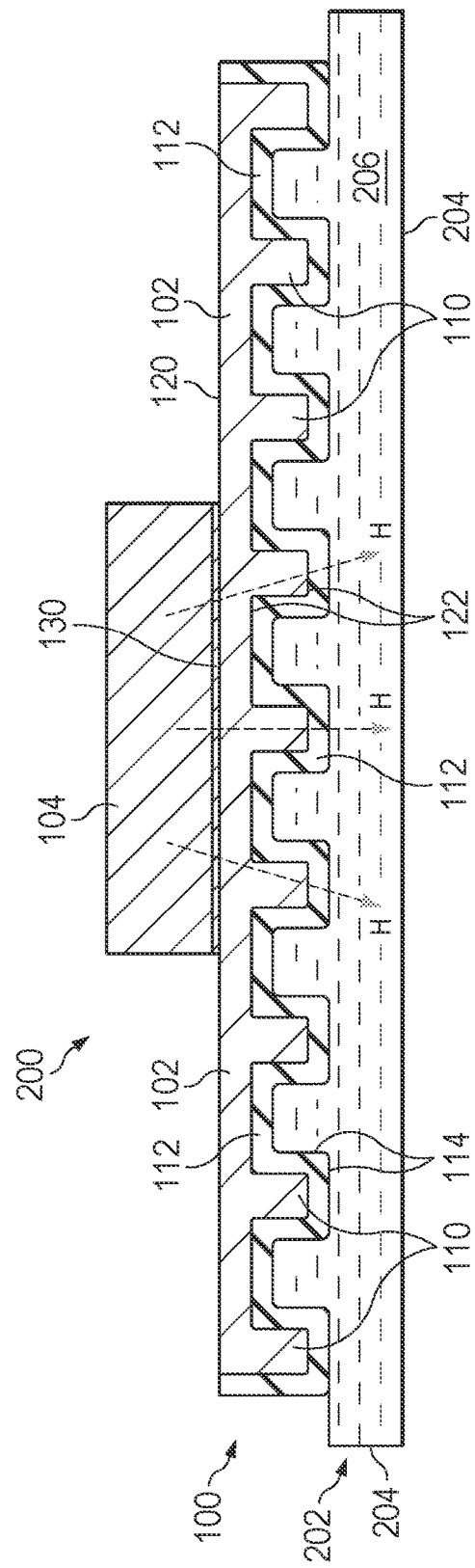
FIG. 2 is a side cross-sectional view of an example fluid-cooled busbar system including the example busbar and heat-generating electronic device shown in FIG. 1 and an example fluid cooling system thermally coupled to the busbar.

FIG. 2 is a side cross-sectional view of an example fluid-cooled busbar system 200 including the example apparatus 100 shown in FIG. 1 and an example fluid cooling system 202 thermally coupled to the busbar 102 to facilitate heat transfer from the heat-generating electronic device 104, e.g., as generally represented by arrows labelled "H". The example fluid cooling system 202 includes a fluid chamber 204 containing a cooling fluid 206. In this example, the non-planar dielectric surface 114 on the second side 122 of the busbar 102 (defined by the dielectric coating 112 over the non-planar physical structures 110) defines at least a portion of an interior surface of the fluid chamber 204 that is exposed to the cooling fluid 206. The cooling fluid 206 may include water, air, oil, or other fluid.

Figure 3A:
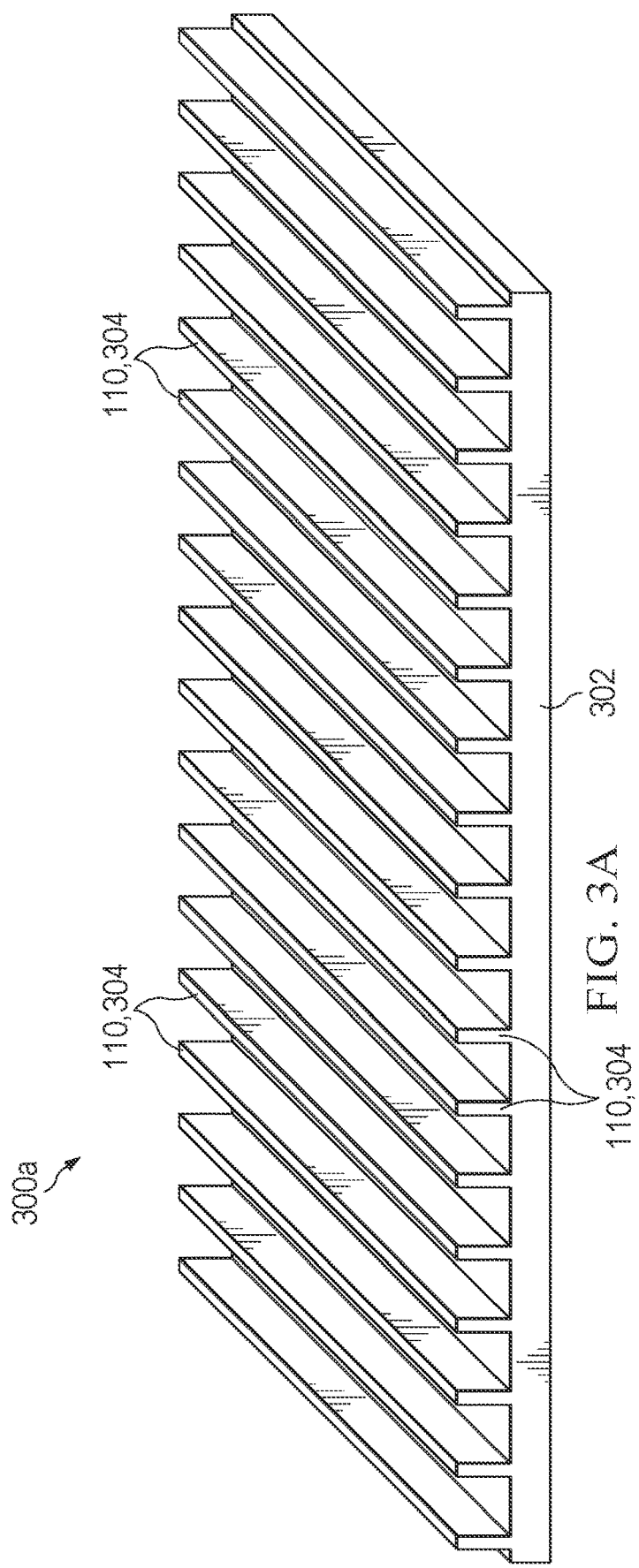

FIGS. 3A and 3B are three-dimensional views of two example busbar structures for the example busbar 102 shown in FIGS. 1 and 2. FIG. 3A shows a first example busbar structure 300a including a planar base portion 302 and an array of fins 304 (defining the array of non-planar physical structures 110) projecting perpendicularly from the planar base portion 302.

FIG. 3B shows a second example busbar structure 300b including a planar base portion 302 and an array of pins or posts 306 (defining the array of non-planar physical structures 110) projecting perpendicularly from the planar base portion 302.

FIG. 4 is a side cross-sectional view of an example apparatus 400 including an example busbar 402 and the heat-generating electronic device 104 mounted on a first side 420 of the busbar 402. Unlike the single-piece busbar 102 shown in FIGS. 1 and 2, busbar 402 shown in FIG. 4 includes multiple distinct busbar components 402a, 402b, and 402c respectively defining terminals 404a, 404b, and 404c, which terminals may be called first terminal 404a, second terminal 404b and third terminal 404c, respectively. The terminals 404a, 404b, and 404c include respective electronic device contacts 416 electrically connected to corresponding elements of the electronic device 104.

In some examples, the apparatus 400 may comprise (or form a part of) a power module including terminals 404a, 404b, and 404c. For example, the apparatus 400 may comprise (or form a part of) a half-bridge device in which terminal 404a defines a +DC terminal, terminal 404b defines a DC GND terminal, and terminal 404c defines an AC terminal.

The respective busbar components 402a, 402b, and 402c (defining terminals 404a, 404b, and 404c) may include a respective array of non-planar physical structures 410 on a second side 422 of the busbar 402, for example including pins, fins, ridges, grooves, a porous structure, or any other non-planar structures, to facilitate heat transfer from the heat-generating electronic device 104, e.g., as generally represented by arrows labelled "H". In some examples, any or all of the busbar components 402a, 402b, and 402c may be crenelated, i.e., wherein the non-planar physical structures 410 comprise an array of crenels and merlons.

In some examples, the respective busbar components 402a, 402b, and 402c may comprise any of the materials and may have any of the characteristics of the busbar 102 discussed above with reference to FIG. 1.

As shown, a dielectric coating 412 may be formed over the respective non-planar physical structures 410 on the busbar components 402a, 402b, and 402c, and may also cover exposed surface(s) 430 of the electronic device 104, to define a non-planar dielectric surface 414 on the second side 422 of the busbar 402. In some examples, the dielectric coating 412 may comprise any of the materials and may have any of the characteristics of the dielectric coating 112 discussed above with reference to FIG. 1.

FIG. 5 is a side cross-sectional view of an example fluid-cooled busbar system 500 including (a) the example apparatus 400 shown in FIG. 4 (e.g., including the example busbar 402 including busbar components 402a, 402b, and 402c respectively defining terminals 404a, 404b, and 404c) and (b) an example fluid cooling system 502 thermally coupled to the busbar components 402a, 402b, and 402c to facilitate heat transfer from the heat-generating electronic device 104, e.g., as generally represented by arrows labelled "H". The example fluid cooling system 502 includes a fluid chamber 504 containing a cooling fluid 506, e.g., comprising water, air, oil, or other fluid. In this example, the non-planar dielectric surface 414 on the second side 422 of the busbar 402 (defined by the dielectric coating 412 covering the respective non-planar physical structures 410 and exposed surface(s) 430 of the electronic device 104) defines at least a portion of an interior surface of the fluid chamber 504 that is exposed to the cooling fluid 506.

Figure 6:
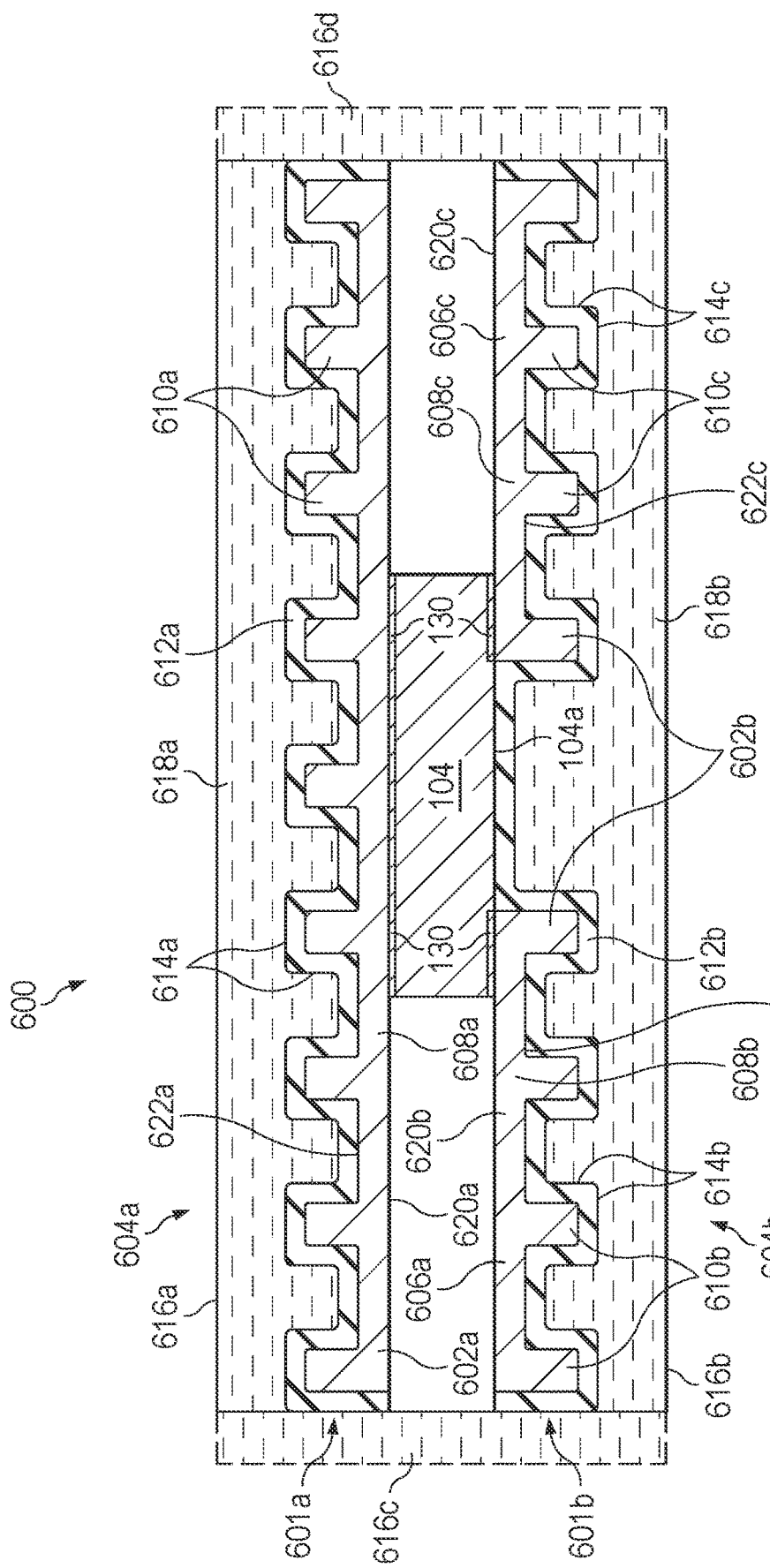
FIG. 6 shows a side cross-sectional view of an example apparatus including an example heat-generating electronic device mounted between a first fluid-cooled busbar apparatus and a second fluid-cooled busbar apparatus.

FIG. 6 shows a side cross-sectional view of an example apparatus 600 including an example heat-generating electronic device 104 mounted between a first fluid-cooled busbar apparatus 601a and a second fluid-cooled busbar apparatus 601b. The first fluid-cooled busbar apparatus 601a includes a first busbar 602a and a first fluid cooling system 604a. The second fluid-cooled busbar apparatus 601b includes a second busbar 602b and a second fluid cooling system 604b. The first busbar 602a comprises a single continuous structure defining a first terminal indicated at 608a. The second busbar 602b includes two discrete busbar components 606a and 606b respectively defining a second terminal 608b and a third terminal 608c.

The electronic device 104 is mounted between the first busbar 602a and second busbar 602b and electrically coupled respectively to the three terminals 608a, 608b, and 608c. As shown, the electronic device 104 is mounted to, and thereby electrically and thermally coupled to, (a) a first side 620a of the first terminal 608a, (b) a first side 620b of the busbar component 606a, and (c) a first side 620c of the busbar component 606b.

In some examples, the example apparatus 600 comprises a power module including three terminals, i.e., first terminal 608a, second terminal 608b, and third terminal 608c. For example, apparatus 600 may comprise a half-bridge device, wherein the first terminal 602a comprises an AC terminal, the second terminal 602b comprises a +DC terminal, and the third terminal 602c comprises a DC GND terminal.

The first busbar 602a includes an array of non-planar physical structures 610a on a second side 622a of the first busbar 602a opposite the first side 620a. The non-planar physical structures 610a may include pins, fins, ridges, grooves, a porous structure, or any other non-planar structures, e.g., as discussed above regarding non-planar physical structures 110 and 410. A dielectric coating 612a formed over the array of non-planar physical structures 610a defines a non-planar dielectric surface 614a. In some examples, the dielectric coating 612a may comprise any of the materials and may have any of the characteristics of the dielectric coating 112 discussed above with reference to FIG. 1.

The first fluid cooling system 604a includes a first fluid chamber 616a containing a first cooling fluid 618a, e.g., water, air, oil, or other fluid. As shown, the non-planar dielectric surface 614a (defined by the dielectric coating 612a covering the array of non-planar physical structures 610a) defines at least a portion of an interior surface of the first fluid chamber 616a that is exposed to the first cooling fluid 618a.

The second busbar 602b includes (a) an array of non-planar physical structures 610b on a second side 622b of the busbar component 606a opposite the first side 620b of the busbar component 606a, and (b) an array of non-planar physical structures 610c on a second side 622c of the busbar component 606b opposite the first side 620c of the busbar component 606b. The non-planar physical structures 610b and/or 610c may include pins, fins, ridges, grooves, a porous structure, or any other non-planar structures, e.g., as discussed above regarding non-planar physical structures 110. In some examples, the first busbar 602a and second busbar 602b (including busbar components 606a and 606b) may comprise any of the materials and may have any of the characteristics of the busbar 102 discussed above with reference to FIG. 1.

A dielectric coating 612b formed over the non-planar physical structures 610b and 610c, and may also cover exposed surface(s) 630 of the electronic device 104, defines a non-planar dielectric surface 614b. In some examples, the dielectric coating 612b may comprise any of the materials and may have any of the characteristics of the dielectric coating 112 discussed above with reference to FIG. 1.

The second fluid cooling system 604b includes a second fluid chamber 616b containing a second cooling fluid 618b, e.g., water, air, oil, or other fluid. As shown, the non-planar dielectric surface 614b (defined by the dielectric coating 612a covering the non-planar physical structures 610b and 610c and exposed surface(s) 630 of the electronic device 104) defines at least a portion of an interior surface of the second fluid chamber 616b that is exposed to the second cooling fluid 618b.

In some examples, the first fluid chamber 616a and the second fluid chamber 616b are distinct chambers, wherein the first cooling fluid 618a and the second cooling fluid 618b may comprise the same type of fluid or different fluids. In other examples, the first fluid chamber 616a and the second fluid chamber 616b comprise portions of a common fluid chamber, wherein the first cooling fluid 618a and second cooling fluid 618b are portions of a common volume of fluid in the common fluid chamber. For example, the first fluid chamber 616a and second fluid chamber 616b may be connected by optional fluid chamber sections 616c and/or 616d.

Figure 7:
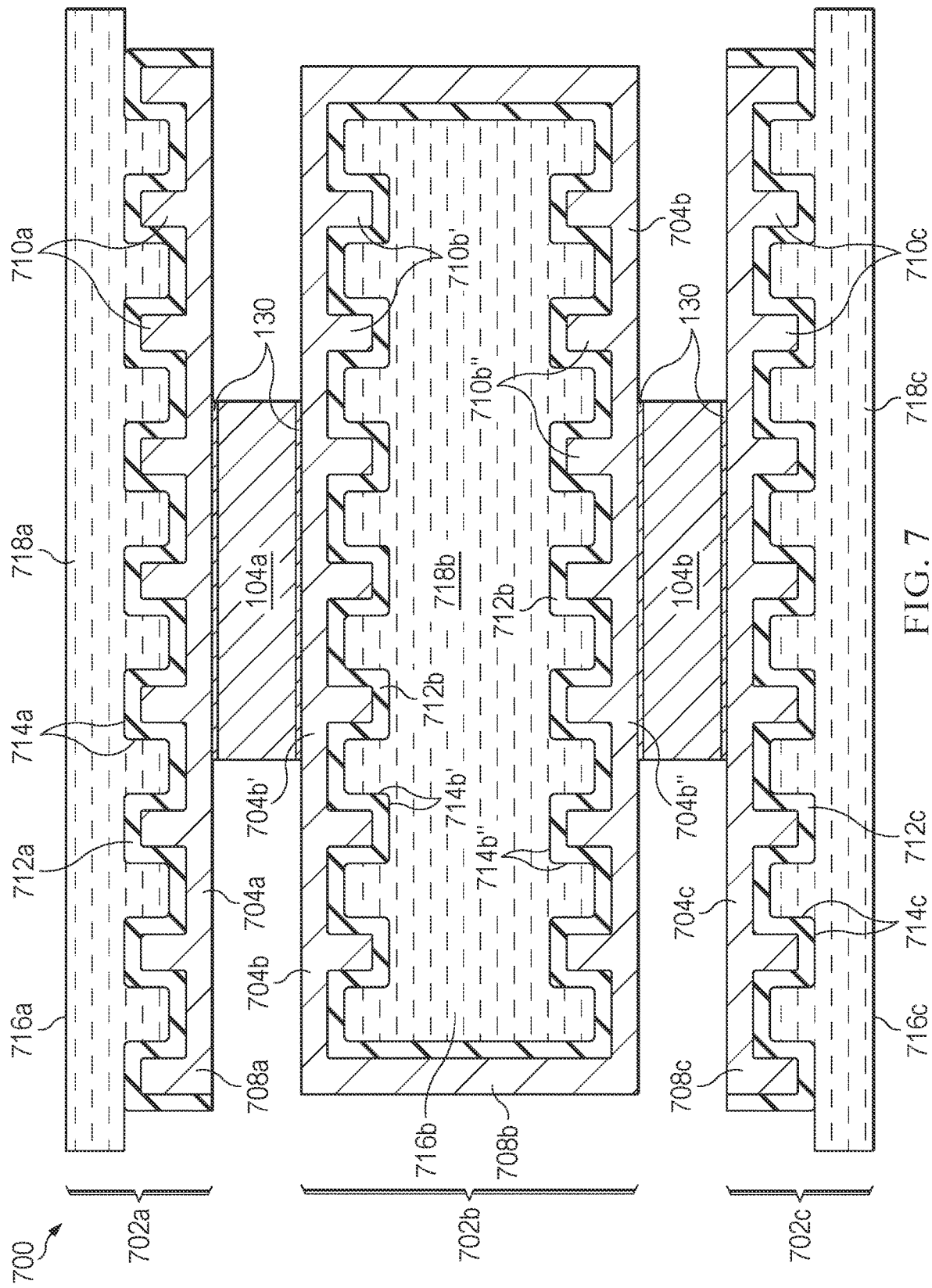
FIG. 7 shows a side cross-sectional view of an example device, e.g., a half-bridge device, including two heat-generating electronic devices mounted between three fluid-cooled busbar apparatuses.

FIG. 7 shows a side cross-sectional view of an example device 700 including a first heat-generating electronic device 104a mounted between a first fluid-cooled busbar apparatus 702a and a second fluid-cooled busbar apparatus 702b, and a second heat-generating electronic device 104b mounted between the second fluid-cooled busbar apparatus 702b and a third fluid-cooled busbar apparatus 702c.

The first heat-generating electronic device 104a is mounted to a first side of the first busbar 704a. The first fluid-cooled busbar apparatus 702a includes (a) a first busbar 704a including an array of non-planar physical structures 710a on a second side of the first busbar 704a, (b) a dielectric coating 712a formed on the array of non-planar physical structures 710a to define a non-planar dielectric surface 714a, and (c) a first fluid chamber 716a containing a first cooling fluid 718a. The first fluid chamber 716a has an interior surface defined at least in part by the non-planar dielectric surface 714a defined by the dielectric coating 712a formed on the first busbar 704a.

The second fluid-cooled busbar apparatus 702b includes (a) a second busbar 704b (b) a dielectric coating 712b, and (c) a second fluid chamber 716b containing a second cooling fluid 718b. In this example, the second busbar 704b has a closed-loop shape extending around the second fluid chamber 716b. The closed-loop shape of the second busbar 704b includes a second busbar first portion 704b' at a first side of the second fluid chamber 716b (near the first heat-generating electronic device 104a), and a second busbar second portion 704b'' at a second side of the second fluid chamber 716b (near the second heat-generating electronic device 104b). The second busbar first portion 704b' includes an array of non-planar physical structures 710b', and second busbar second portion 704b'' includes an array of non-planar physical structures 710b'', wherein the non-planar physical structures 710b' and 710b'' are located on an interior side of the closed-loop second busbar 704b facing the second fluid chamber 716b. The first heat-generating electronic device 104a is mounted to a first, exterior side of the second busbar first portion 704b' (opposite a second, interior side of the second busbar first portion 704b' facing the second fluid chamber 716b), and the second heat-generating electronic device 704b is mounted to a first, exterior side of the second busbar second portion 704b'' (opposite a second, interior side of the second busbar second portion 704b'' facing the second fluid chamber 716b).

A dielectric coating 712b is formed on the interior side of the closed-loop second busbar 704b facing the second fluid chamber 716b, and covers (a) over the array of non-planar physical structures 710b' to define a non-planar dielectric surface 714b' on the interior side (facing the second fluid chamber 716b) of the second busbar first portion 704b' and (b) a non-planar dielectric surface 714b'' on the interior side (facing the second fluid chamber 716b) of the second busbar second portion 704b''. The non-planar dielectric surfaces 714b' and 714b'' define respective portions of an interior surface of the second fluid chamber 716b exposed to the second cooling fluid 718b.

The second heat-generating electronic device 104b is mounted to a first side of the third busbar 704c. The third fluid-cooled busbar apparatus 702c includes (a) a third busbar 704c including an array of non-planar physical structures 710c on a second side of the third busbar 704c, (b) a dielectric coating 712c formed on the array of non-planar physical structures 710c to define a non-planar dielectric surface 714c, and (c) a third fluid chamber 716c containing a third cooling fluid 718c. The third fluid chamber 716c has an interior surface defined at least in part by the non-planar dielectric surface 714c defined by the dielectric coating 712c formed on the third busbar 704c.

The respective arrays of non-planar physical structures 710a, 710b, and 710c may respectively include pins, fins, ridges, grooves, a porous structure, or any other non-planar structures, e.g., as discussed above regarding non-planar physical structures 110. In some examples, the first busbar 704a, second busbar 704b, and third busbar 704c may respectively comprise any of the materials and may have any of the characteristics of the busbar 102 discussed above with reference to FIG. 1.

In addition, the respective dielectric coatings 712a, 712b, and 712c may respectively comprise any of the materials and may have any of the characteristics of the dielectric coating 112 discussed above with reference to FIG. 1.

In some examples, the first fluid chamber 716a, second fluid chamber 716b, and third fluid chamber 716c are distinct chambers, wherein the first cooling fluid 718a, second cooling fluid 718b, and third cooling fluid 718b may comprise the same type of fluid or different fluids. In other examples, any two or all three of first fluid chamber 716a, second fluid chamber 716b, and third fluid chamber 716c may comprise portions of a common fluid chamber.

In some examples, the example apparatus 700 comprises a power module, wherein the first busbar 704a, second busbar 704b, and third busbar 704c respectively define a first terminal 708a, a second terminal 708b, and a third terminal 708c of the power module. For example, the apparatus 700 may comprises a half-bridge device, wherein the first heat-generating electronic device 104a is a "high side" power module component, the second heat-generating electronic device 104b is a "low side" power module component, the first terminal 708a comprises a +DC terminal, the second terminal 708b comprises an AC terminal, and the third terminal 708c comprises a DC GND terminal.

The invention claimed is:

1. An apparatus, comprising:
   a busbar;
   a heat-generating electronic device mounted on a first side of the busbar, the heat-generating electronic device being electrically and thermally coupled to the first side of the busbar;
   the busbar including an array of non-planar physical structures on a second side of the busbar opposite the first side of the busbar; and
   a dielectric coating on the array of non-planar physical structures, the dielectric coating comprising multiple layers of different materials and defining a non-planar dielectric surface on the second side of the busbar.

2. The apparatus of claim 1, further comprising a fluid chamber to receive a cooling fluid, wherein the non-planar dielectric surface on the first side of the busbar defines at least a portion of an interior surface of the fluid chamber.

3. The apparatus of claim 1, wherein:
   the busbar comprises copper, aluminum, silver, or gold, an alloy of copper, an alloy of aluminum, an alloy of silver, or an alloy of gold; and
   the dielectric coating comprises a polymer, a ceramic, an epoxy, polyphenylene sulfide (PPS), liquid crystal polymer (LCP), polytetrafluoroethylene (PTFE), parylene, polyether ether ketone (PEEK), or a composition including PEEK and parylene.

4. The apparatus of claim 1, wherein:
   the busbar has a thickness in the range of 50 µm-5000 µm; and
   the dielectric coating has a thickness in the range of 0.05 µm-500 µm.

5. The apparatus of claim 1, wherein the array of non-planar physical structures on the busbar comprises pins or fins.

6. The apparatus of claim 1, wherein the busbar includes a hollow or porous structure defining the array of non-planar physical structures.

7. The apparatus of claim 1, wherein a surface area of the non-planar dielectric surface is at least two times a planar footprint area of the non-planar dielectric surface.

8. The apparatus of claim 1, wherein the busbar includes multiple electronic device contacts electrically connected to the heat-generating electronic device.

9. The apparatus of claim 1, wherein the busbar includes multiple distinct busbar components, wherein respective busbar components include respective electronic device contacts electrically connected to the heat-generating electronic device.

10. The apparatus of claim 1, further comprising a thermal interface structure arranged between the heat-generating electronic device and the first side of the busbar, wherein the thermal interface structure and the busbar comprise different metals.

11. An apparatus, comprising:
    a first busbar;
    a second busbar;
    a heat-generating electronic device mounted between a first side of the first busbar and a first side of the second busbar, the heat-generating electronic device being electrically and thermally coupled to both the first side of the first busbar and the first side of the second busbar;
    the first busbar including a first array of non-planar physical structures on a second side of the first busbar opposite the first side of the first busbar;
    a first dielectric coating on the first array of non-planar physical structures defining a first non-planar dielectric surface on the second side of the first busbar;
    the second busbar including a second array of non-planar physical structures on a second side of the second busbar opposite the first side of the second busbar; and
    a second dielectric coating on the second array of non-planar physical structures defining a second non-planar dielectric surface on the second side of the second busbar.

12. The apparatus of claim 11, further comprising:
    a first fluid chamber to receive a first cooling fluid, wherein the first non-planar dielectric surface on the second side of the first busbar defines at least a portion of an interior surface of the first fluid chamber; and
    a second fluid chamber to receive a second cooling fluid, wherein the second non-planar dielectric surface on the second side of the second busbar defines at least a portion of an interior surface of the second fluid chamber.

13. The apparatus of claim 12, wherein the first fluid chamber and the second fluid chamber are both part of a common fluid chamber.

14. The apparatus of claim 12, wherein the second cooling fluid is the same as the first cooling fluid.

15. The apparatus of claim 11, wherein the first array of non-planar physical structures comprises pins or fins.

16. The apparatus of claim 11, wherein the first busbar includes a hollow or porous structure defining the first array of non-planar physical structures.

17. The apparatus of claim 11, wherein:
    a surface area of the first non-planar dielectric surface is at least two times a planar footprint area of the first non-planar dielectric surface; and
    a surface area of the second non-planar dielectric surface is at least two times a planar footprint area of the second non-planar dielectric surface.

18. The apparatus of claim 11, wherein the first dielectric coating comprises multiple layers of different materials.

19. The apparatus of claim 11, wherein each of the first dielectric coating and the dielectric coating respectively comprises multiple layers of different materials.

20. A device, comprising:
    a first heat-generating electronic device;
    a second heat-generating electronic device;
    a first fluid-cooled busbar apparatus including:
       a first busbar mounted to a first side of the first heat-generating electronic device, the first busbar including a first array of non-planar physical structures;

a first dielectric coating on the first array of non-planar physical structures defining a first non-planar dielectric surface on the first busbar; and a first fluid chamber to receive a first cooling fluid, the first fluid chamber having an interior surface at least a portion of which is defined by the first non-planar dielectric surface on the first busbar;

a second fluid-cooled busbar apparatus including:

a second busbar including:

a second busbar first portion mounted to a second side of the first heat-generating electronic device, the second busbar first portion including a second array of non-planar physical structures;

a second dielectric coating on the second array of non-planar physical structures defining a second non-planar dielectric surface on the second busbar first portion; and a second busbar second portion mounted to a first side of the second heat-generating electronic device, the second busbar second portion including a third array of non-planar physical structures spaced apart from the second array of non-planar physical structures on the second busbar first portion;

a third dielectric coating on the third array of non-planar physical structures defining a third non-planar dielectric surface on the second busbar second portion spaced apart from the second non-planar dielectric surface on the second busbar first portion; and a second fluid chamber between the second busbar first portion and second busbar second portion to receive a second cooling fluid, the second fluid chamber having an interior surface defined at least by the second non-planar dielectric surface on the second busbar first portion and the third non-planar dielectric surface on the second busbar second portion;

a third fluid-cooled busbar apparatus including:

a third busbar mounted to a second side of the second heat-generating electronic device, the third busbar including a fourth array of non-planar physical structures;

a fourth dielectric coating on the fourth array of non-planar physical structures defining a fourth non-planar dielectric surface on the third busbar; and a third fluid chamber to receive a third cooling fluid, the third fluid chamber having an interior surface at least a portion of which is defined by the fourth non-planar dielectric surface on the third busbar.

21. The device of claim 20, wherein:
the first busbar defines a first terminal;
the second busbar defines a second terminal; and
the third busbar defines a third terminal.

22. The device of claim 21, wherein:
the device comprises a half-bridge device;
the first terminal comprises a +DC terminal;
the second terminal comprises an AC terminal; and
the third terminal comprises a DC GND terminal.

* * * * *